US008841064B2

(12) United States Patent  
Cha et al.

(10) Patent No.: US 8,841,064 B2  
(45) Date of Patent: Sep. 23, 2014

(54) POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

(75) Inventors: Myoung-Hwan Cha, Uiwang-si (KR); Jong-Hwa Lee, Uiwang-si (KR); Mi-Ra Im, Uiwang-si (KR); Min-Kook Chung, Uiwang-si (KR); Ji-Young Jeong, Uiwang-si (KR); Hyun-Yong Cho, Uiwang-si (KR); Hwan-Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 236 days.

(21) Appl. No.: 13/294,223

(22) Filed: Nov. 11, 2011

(65) Prior Publication Data

US 2012/0171614 A1 Jul. 5, 2012

(30) Foreign Application Priority Data

Dec. 31, 2010 (KR) ........................ 10-2010-0140594

(51) Int. Cl.
*G03C 1/06* (2006.01)
*G03C 1/00* (2006.01)
*G03F 7/004* (2006.01)
*G03F 7/008* (2006.01)
*G03F 7/016* (2006.01)
*G03F 7/031* (2006.01)
*G03F 7/023* (2006.01)
*H01L 23/29* (2006.01)
*G03F 7/022* (2006.01)
*G03F 7/075* (2006.01)

(52) U.S. Cl.
CPC ............ *H01L 23/296* (2013.01); *G03F 7/0233* (2013.01); *G03F 7/0226* (2013.01); *G03F 7/0751* (2013.01)
USPC .................. 430/283.1; 430/270.1; 430/280.1; 430/281.1; 522/162; 522/168; 522/169; 522/173; 522/151; 522/71; 522/74; 522/65

(58) Field of Classification Search
USPC .................. 430/270.1, 280.1, 281.1, 283.1; 522/162, 168, 169, 173, 151, 71, 74
See application file for complete search history.

(56) References Cited

U.S. PATENT DOCUMENTS

| 2,772,975 | A | 12/1956 | Rickers |
|---|---|---|---|
| 2,797,213 | A | 6/1957 | Moore |
| 3,669,658 | A | 6/1972 | Yonezawa et al. |
| 5,077,378 | A | 12/1991 | Mueller et al. |
| 5,106,899 | A | 4/1992 | Maresca |
| 5,114,826 | A | 5/1992 | Kwong et al. |
| 5,376,499 | A | 12/1994 | Hammerschmidt et al. |
| 5,449,584 | A | 9/1995 | Banba et al. |
| 5,486,447 | A | 1/1996 | Hammerschmidt et al. |
| 5,858,584 | A | 1/1999 | Okabe et al. |
| 6,001,517 | A | 12/1999 | Kawamonzen |
| 6,207,356 | B1 | 3/2001 | Banba et al. |
| 6,232,032 | B1 | 5/2001 | Nunomura et al. |
| 6,376,151 | B1 | 4/2002 | Takahashi et al. |
| 6,808,862 | B2 | 10/2004 | Kodama |
| 6,929,890 | B2 | 8/2005 | Miyoshi et al. |
| 7,056,641 | B2 | 6/2006 | Naiini et al. |
| 7,218,082 | B2 | 5/2007 | Walter et al. |
| 7,371,506 | B2 | 5/2008 | Fujii et al. |
| 7,416,830 | B2 | 8/2008 | Naiini et al. |
| 7,687,208 | B2 | 3/2010 | Shibui |
| 8,080,350 | B2 | 12/2011 | Banba et al. |
| 8,198,002 | B2 | 6/2012 | Jung et al. |
| 2002/0090564 | A1 | 7/2002 | Suwa et al. |
| 2004/0142275 | A1 | 7/2004 | Komatsu |
| 2004/0229167 | A1 | 11/2004 | Naiini et al. |
| 2005/0202337 | A1 | 9/2005 | Miyoshi et al. |
| 2009/0068587 | A1 | 3/2009 | Maeda et al. |
| 2009/0202794 | A1 | 8/2009 | Shibui |
| 2011/0159428 | A1 | 6/2011 | Lee et al. |
| 2011/0171578 | A1 | 7/2011 | Cho et al. |
| 2011/0294066 | A1 | 12/2011 | Hasegawa |

FOREIGN PATENT DOCUMENTS

| CN | 1356356 | | 7/2002 |
|---|---|---|---|
| CN | 1831648 | A | 9/2006 |
| CN | 101727006 | A | 6/2010 |
| CN | 102109763 | A | 6/2011 |
| EP | 0424940 | A2 | 5/1991 |
| EP | 0491188 | A2 | 6/1992 |
| JP | 63-096162 | | 4/1988 |
| JP | 03-209478 | A | 9/1991 |
| JP | 04-031860 | A | 2/1992 |
| JP | 11-044948 | A | 2/1992 |
| JP | 11-65107 | A | 3/1993 |
| JP | 07-281441 | | 10/1995 |
| JP | 08-022118 | A | 1/1996 |

(Continued)

OTHER PUBLICATIONS

Chinese Search Report in counterpart Chinese Application No. 201103490545 dated Jan. 25, 2013, pp. 1-3.

(Continued)

*Primary Examiner* — Sanza McClendon

(74) *Attorney, Agent, or Firm* — Additon, Higgins & Pendleton, P.A.

(57) ABSTRACT

Disclosed are a positive photosensitive resin composition that includes (A) an alkali soluble resin; (B) a dissolution controlling agent including the compound represented by Chemical Formula 6; (C) a photosensitive diazoquinone compound; (D) a silane compound; and (E) a solvent, and a photosensitive resin film prepared by using the same.

10 Claims, No Drawings

(56) References Cited

FOREIGN PATENT DOCUMENTS

| | | |
|---|---|---|
| JP | 09-302221 | 11/1997 |
| JP | 10-307393 | 11/1998 |
| JP | 2000-199958 A | 7/2000 |
| JP | 2000-292913 | 10/2000 |
| JP | 2004-170611 | 6/2004 |
| JP | 2004-334089 | 11/2004 |
| JP | 2005-043883 A | 2/2005 |
| JP | 2006-178437 A | 7/2006 |
| JP | 2006-349700 A | 12/2006 |
| JP | 2007-304125 | 11/2007 |
| JP | 4105919 B2 | 6/2008 |
| KR | 10-0183990 | 4/1999 |
| KR | 10-1999-0088649 A | 12/1999 |
| KR | 10-2001-0088824 A | 9/2001 |
| KR | 10-2006-0002051 A | 1/2006 |
| KR | 10-2006-0023520 A | 3/2006 |
| KR | 10-2006-0085166 A | 7/2006 |
| KR | 10-2007-0007026 A | 1/2007 |
| KR | 10-2008-0072083 A | 8/2008 |
| KR | 10-2009-0019731 A | 2/2009 |
| KR | 10-2009-0051028 A | 5/2009 |
| KR | 10-2009-0056737 A | 6/2009 |
| KR | 10-2010-0036115 A | 4/2010 |
| KR | 10-2010-0039009 A | 4/2010 |
| KR | 10-2011-0076492 A | 7/2011 |
| TW | 200504464 A | 2/2005 |
| TW | 200712778 | 4/2007 |
| TW | 201015224 | 4/2010 |
| TW | 201035242 | 10/2010 |
| WO | 2004/109400 A2 | 12/2004 |
| WO | 2008-020573 A1 | 2/2008 |
| WO | 2009/145227 A1 | 12/2009 |
| WO | 2010/035925 A1 | 4/2010 |

OTHER PUBLICATIONS

"N-methylpyrrolidone", Solvent properties, (http://macro.Isu.edu/HowTo/solvents/N-Methylpyrrolidone.htm) pp. 1.

Taiwanese Search Report in commonly owned Taiwanese Application No. 99144461 dated Mar. 28, 2013, pp. 1.

Office Action in commonly owned U.S. Appl. No. 12/964,010 mailed Mar. 28, 2012, pp. 1-8.

Final Office Action in commonly owned U.S. Appl. No. 12/964,010 mailed Nov. 20, 2012, pp. 1-13.

Advisory Action in commonly owned U.S. Appl. No. 12/964,010 mailed Feb. 13, 2013, pp. 1-6.

CRC Handbook of Chemistry and Physics; Haynes et al.; 9th ed. 2013, pp. 1-2.

Gore et al., "Molecular Polarisability, The Conformations of Diphenyl Ketone, Dimesityl Ketone, and Mesityl Phenyl Ketone as Solutes", J. Chem. Soc. (B), 1967, pp. 741-742.

International Search Report and Written Opinion in commonly owned International Application No. PCT/KR2008/007903 dated Aug. 10, 2009, pp. 1-6.

Office Action in commonly owned U.S. Appl. No. 13/073,005 mailed Oct. 4, 2012, pp. 1-8.

Office Action in commonly owned U.S. Appl. No. 13/073,005 mailed Mar. 7, 2013, pp. 1-7.

Final Office Action in commonly owned U.S. Appl. No. 13/073,005 mailed Aug. 23, 2013, pp. 1-5.

Search Report in counterpart Taiwanese Application No. 100141829 dated Oct. 10, 2013, pp. 1-2.

POSITIVE PHOTOSENSITIVE RESIN COMPOSITION, PHOTOSENSITIVE RESIN FILM PREPARED BY USING THE SAME, AND SEMICONDUCTOR DEVICE INCLUDING THE PHOTOSENSITIVE RESIN FILM

CROSS-REFERENCE TO RELATED APPLICATION

This application claims priority to and the benefit of Korean Patent Application No. 10-2010-0140594 filed in the Korean Intellectual Property Office on Dec. 31, 2010, the entire disclosure of which is incorporated herein by reference.

FIELD OF THE INVENTION

This disclosure relates to a positive photosensitive resin composition, a photosensitive resin film prepared by using the same and a semiconductor device including the photosensitive resin film.

BACKGROUND OF THE INVENTION

The conventional surface protective layer and interlayer insulating layer for a semiconductor device includes a polyimide resin that can have excellent heat resistance, electrical properties, mechanical properties, and the like, as an alkali soluble resin. The polyimide resin has recently been used as a photosensitive polyimide precursor composition which can be coated easily. The photosensitive polyimide precursor composition can be coated on a semiconductor device, patterned by ultraviolet (UV) rays, developed, and heat imidized, to easily provide a surface protective layer, an interlayer insulating layer, and the like.

The photosensitive polyimide precursor composition can be a positive type in which an exposed part is dissolved by development, or a negative type in which the exposed part is cured and maintained. Positive type compositions can be developed by a non-toxic alkali aqueous solution.

The positive photosensitive polyimide precursor composition can include a polyimide precursor of polyamic acid, a photosensitive material of diazonaphthoquinone, and the like. However, it can be difficult to obtain a desired pattern using the positive photosensitive polyimide precursor composition because the carboxylic acid of the polyamic acid is too highly soluble in an alkali.

In order to solve this problem, a material in which a polybenzoxazole precursor is mixed with a diazonaphthoquinone compound has drawn attention. When the polybenzoxazole precursor composition is actually used, however, film loss of an unexposed part can be significantly increased, so it can be difficult to obtain a desirable pattern after the developing process.

In order to improve this, if the molecular weight of the polybenzoxazole precursor is increased, the amount of film loss of the unexposed part can be reduced. Development residue (scum), however, can be generated, so resolution may be decreased and the development duration on the exposed part may be increased.

In order to solve this problem, film loss can be suppressed in non-exposed parts during development by adding a certain phenol compound to a polybenzoxazole precursor composition. However, the effect of suppressing the film loss of the unexposed part is insufficient. Accordingly, there is still a need to increase the effects of suppressing film loss, along with preventing generation of development residue (scum). In addition, there is a need for research directed to a dissolution-suppressing agent, since phenol compounds typically used to adjust solubility can decompose at high temperatures during curing, can undergo a side reaction, or the like, which can damage mechanical properties of a cured film.

Furthermore, when this polyimide precursor composition or polybenzoxazole precursor composition is prepared into a thermally cured film, the film can remain in the semiconductor device and can act as a surface protective layer, and accordingly the thermally cured film should have excellent mechanical properties such as tensile strength, elongation, Young's modulus, and the like. However, generally-used polyimide precursors or polybenzoxazole precursors tend to have inappropriate mechanical properties, and in particular, elongation, and also can have poor heat resistance.

In order to solve this problem, various additives can be added thereto or a precursor compound that is cross-linkable during the thermal curing can be used. However, while such additives and/or precursor compounds may improve mechanical properties, and in particular elongation, they may not provide desired optical properties such as sensitivity, resolution, and the like. Accordingly, there is still a need for methods that do not deteriorate these optical properties and can still attain excellent mechanical properties.

SUMMARY OF THE INVENTION

One embodiment provides a positive photosensitive resin composition that can have excellent film residue ratio, sensitivity, and resolution.

Another embodiment provides a photosensitive resin film fabricated by using the positive photosensitive resin composition.

A further embodiment provides a semiconductor device including the photosensitive resin film.

According to an embodiment, provided is a positive photosensitive resin composition that includes (A) an alkali soluble resin; (B) a dissolution controlling agent including the compound represented by the following Chemical Formula 6; (C) a photosensitive diazoquinone compound; (D) a silane compound; and (E) a solvent.

[Chemical Formula 6]

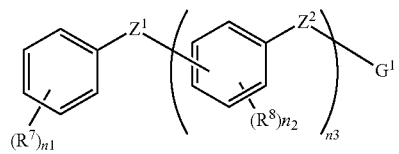

In Chemical Formula 6, $Z^1$ and $Z^2$ are the same or different and are each independently a single bond, —O—, —CO—, —CONH—, —S—, —$SO_2$—, substituted or unsubstituted C1 to C10 alkyleneoxy (—$OR^{203}$—, wherein $R^{203}$ is substituted or unsubstituted alkylene), or substituted or unsubstituted C6 to C15 aryleneoxy (—$OR^{204}$—, wherein $R^{204}$ is substituted or unsubstituted arylene), $G^1$ is hydrogen, a substituted or unsubstituted C1 to C30 aliphatic organic group, a substituted or unsubstituted C3 to C30 alicyclic organic group, a substituted or unsubstituted C6 to C30 aromatic organic group, a substituted or unsubstituted C2 to C30 heterocyclic group, or -$T^1$-$R^{300}$, wherein $T^1$ is a single bond, —O—, —CO—, —CONH—, —S—, —$SO_2$—, substituted or unsubstituted C1 to C10 alkyleneoxy (—OR$^{301}$—, wherein R$^{301}$ is substituted or unsubstituted alkylene), or substituted or unsubstituted C6 to C15 aryleneoxy (—OR$^{302}$—, wherein R$^{302}$ is substituted or unsubstituted arylene), and R$^{300}$ is a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group, R$^7$ and R$^8$ are the same or different and are each independently hydrogen or a substituted or unsubstituted C1 to C30 aliphatic organic group, n1 is an integer ranging from 0 to 5, n2 is an integer ranging from 0 to 4, and n3 is an integer ranging from 0 to 10.

In exemplary embodiments, the compound represented by the above Chemical Formula 6 may include a compound represented by the following Chemical Formulas 6a to 6f, or a combination thereof.

[Chemical Formula 6a]

[Chemical Formula 6b]

[Chemical Formula 6c]

[Chemical Formula 6d]

[Chemical Formula 6e]

[Chemical Formula 6f]

In Chemical Formulas 6a to 6f,

T$^2$ to T$^{11}$ are the same or different and are each independently a single bond, —O—, —CO—, —CONH—, —S—, —SO$_2$—, substituted or unsubstituted C1 to C10 alkyleneoxy (—OR$^{400}$—, wherein R$^{400}$ is substituted or unsubstituted alkylene), or substituted or unsubstituted C6 to C15 aryleneoxy (—OR$^{401}$—, wherein R$^{401}$ is substituted or unsubstituted arylene).

In exemplary embodiments, the compound represented by the above Chemical Formula 6 may include a compound represented by the following Chemical Formulas 40 to 45, or a combination thereof.

[Chemical Formula 40]

[Chemical Formula 41]

[Chemical Formula 42]

[Chemical Formula 43]

[Chemical Formula 44]

[Chemical Formula 45]

The alkali soluble resin may be a polybenzoxazole precursor, and the polybenzoxazole precursor may include a first polybenzoxazole precursor including a repeating unit represented by the following Chemical Formula 1, a repeating unit represented by the following Chemical Formula 2, or a combination thereof, and including a thermally polymerizable functional group at at least one terminal end of the first polybenzoxazole precursor; a second polybenzoxazole precursor including a repeating unit represented by the following Chemical Formula 4, a repeating unit represented by the following Chemical Formula 5, or a combination thereof; or a combination thereof.

[Chemical Formula 1]

[Chemical Formula 2]

In Chemical Formulas 1 and 2,

X$^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 3, and $Y^1$ and $Y^2$ are the same or different in each repeating unit and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 3]

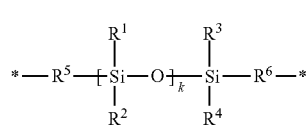

In Chemical Formula 3, $R^1$ to $R^4$ are the same or different and are each independently hydrogen, substituted or unsubstituted C1 to C30 alkyl, substituted or unsubstituted C6 to C30 aryl, substituted or unsubstituted C1 to C30 alkoxy, or hydroxy, $R^5$ and $R^6$ are the same or different and are each independently a single bond, substituted or unsubstituted C1 to C30 alkylene, or substituted or unsubstituted C6 to C30 arylene, and k is an integer ranging from 1 to 50.

[Chemical Formula 4]

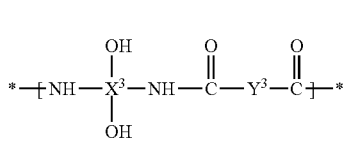

[Chemical Formula 5]

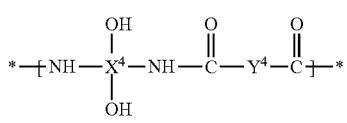

In Chemical Formulas 4 and 5, $X^3$ and $X^4$ are the same or different in each repeating unit and are each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and is a thermally polymerizable organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The alkali soluble resin (A) may have a weight average molecular weight (Mw) of about 3,000 g/mol to about 50,000 g/mol.

The positive photosensitive resin composition may include about 0.1 parts by weight to about 30 parts by weight of the dissolution controlling agent (B); about 5 parts by weight to about 100 parts by weight of the photosensitive diazoquinone compound (C); about 0.1 parts by weight to about 30 parts by weight of the silane compound (D); and about 50 parts by weight to about 900 parts by weight of the solvent (E) based on about 100 parts by weight of the alkali soluble resin (A).

According to another embodiment, a photosensitive resin film fabricated using the positive photosensitive resin composition is provided.

According to a further embodiment, a semiconductor device including the photosensitive resin film is provided.

Hereinafter, further embodiments of the present invention will be described in detail.

The positive photosensitive resin composition includes a dissolution controlling agent having a predetermined structure, and accordingly the dissolution rate between an exposed part and an unexposed part may be controlled, which can improve film residue ratio, sensitivity, and resolution.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to one substituted with at least a substituent comprising halogen (—F, —Cl, —Br, or —I), hydroxy, nitro, cyano, amino($NH_2$, $NH(R^{200})$, or $N(R^{201})(R^{202})$), wherein $R^{200}$, $R^{201}$ and $R^{202}$ are the same or different and are each independently C1 to C10 alkyl), amidino, hydrazine, hydrazone, carboxyl, substituted or unsubstituted alkyl, substituted or unsubstituted alkenyl, substituted or unsubstituted alkynyl, substituted or unsubstituted alicyclic organic group, substituted or unsubstituted aryl, substituted or unsubstituted heterocyclic group, or a combination thereof, instead of at least one hydrogen of a functional group.

As used herein, when a specific definition is not otherwise provided, the term "alkyl" may refer to C1 to C30 alkyl, for example C1 to C15 alkyl, the term "cycloalkyl" may refer to C3 to C30 cycloalkyl, for example C3 to C18 cycloalkyl, the term "alkoxy" may refer to C1 to C30 alkoxy, for example C1 to C18 alkoxy, the term "aryl" may refer to C6 to C30 aryl, for example C6 to C18 aryl, the term "alkenyl" may refer to C2 to C30 alkenyl, for example C2 to C18 alkenyl, the term "alkylene" may refer to C1 to C30 alkylene, for example C1 to C18 alkylene, the term "arylene" may refer to C6 to C30 arylene, for example C6 to C18 arylene, and the term "alkynyl" may refer to C2 to C30 alkynyl, for example C2 to C16 alkynyl.

As used herein, when a specific definition is not otherwise provided, the term "aliphatic organic group" may refer to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" may refer to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, and the term "aromatic organic group" may refer to C6 to C30 aryl or C6 to C30 arylene, for example C6 to C16 aryl or C6 C16 arylene.

As used herein, when a specific definition is not otherwise provided, the term "heterocyclic group" may refer to C2 to C30 heterocycloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that include 1 to 3 heteroatoms comprising O, S, N, P, Si, or a combination thereof in one ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 heteroatoms comprising O, S, N, P, Si, or a combination thereof in one ring.

As used herein, when a specific definition is not otherwise provided, the term "combination" refers to mixing or copolymerization. Also, the term "copolymerization" refers to block copolymerization or random copolymerization, and the term "copolymer" refers to a block copolymer or a random copolymer.

Also, "*" refers to a linking part between the same or different atoms, or chemical formulas.

According to one embodiment, a positive photosensitive resin composition includes (A) an alkali soluble resin; (B) a dissolution controlling agent including the compound represented by the following Chemical Formula 6; (C) a photosensitive diazoquinone compound; (D) a silane compound; and (E) a solvent.

The positive photosensitive resin composition may include one or more additional additive(s) (F).

[Chemical Formula 6]

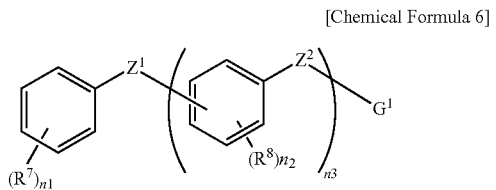

In Chemical Formula 6, $Z^1$ and $Z^2$ are the same or different and are each independently a single bond, —O—, —CO—, —CONH—, —S—, —SO$_2$—, substituted or unsubstituted C1 to C10 alkyleneoxy (—OR$^{203}$—, wherein R$^{203}$ is substituted or unsubstituted alkylene), or substituted or unsubstituted C6 to C15 aryleneoxy (—OR$^{204}$—, wherein R$^{204}$ is substituted or unsubstituted arylene), for example —O— or substituted or unsubstituted C1 to C10 alkyleneoxy.

$G^1$ is hydrogen, a substituted or unsubstituted C1 to C30 aliphatic organic group, a substituted or unsubstituted C3 to C30 alicyclic organic group, a substituted or unsubstituted C6 to C30 aromatic organic group, a substituted or unsubstituted C2 to C30 heterocyclic group, or -T$^1$-R$^{300}$, wherein T$^1$ is a single bond, —O—, —CO—, —CONH—, —S—, —SO$_2$—, substituted or unsubstituted C1 to C10 alkyleneoxy (—OR$^{301}$—, wherein R$^{301}$ is substituted or unsubstituted alkylene), or substituted or unsubstituted C6 to C15 aryleneoxy (—OR$^{302}$—, wherein R$^{302}$ is substituted or unsubstituted arylene), and R$^{300}$ is a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group.

$R^7$ and $R^8$ are the same or different and are each independently hydrogen or a substituted or unsubstituted C1 to C30 aliphatic organic group.

n1 is an integer ranging from 0 to 5, n2 is an integer ranging from 0 to 4, and n3 is an integer ranging from 0 to 10, for example 0 to 5, and as another example 0 to 3.

The compound represented by the above Chemical Formula 6 can include an atom such as oxygen (O), sulfur (S), and the like showing polarity in a part of a molecule and an atom such as carbon (C), hydrogen (H), and the like showing non-polarity in other parts thereof.

When the positive photosensitive resin composition includes a dissolution-controlling agent including the compound represented by the above Chemical Formula 6, a polar atom such as oxygen (O), sulfur (S), and the like in the molecule of a compound represented by the above Chemical Formula 6 can form a hydrogen bond with an alkali soluble resin and a photosensitive diazoquinone compound and may not be exposed on the surface of the unexposed part of a film. On the other hand, non-polar parts of the compound represented by the above Chemical Formula 6 do not participate in hydrogen bonding and can be exposed on the surface of a film. This can minimize or eliminate dissolution of the unexposed part of the film in an alkali developing solution.

In contrast, the photosensitive diazoquinone compound, a photoacid generator, increases the polarity of the exposed part and thus the exposed part can be well dissolved in an alkali developing solution.

In this way, since the unexposed part is controlled to be non-polar, and the exposed part is controlled to be polar, the exposed part may effectively exhibit improved alkali developability and thus, sensitivity and a film residue ratio.

Non-polarity and polarity of the positive photosensitive resin composition may be identified by measuring a contact angle relative to water. Specifically, an unexposed part may have a contact angle relative to water in a range of about 65° to about 80°, and an exposed part may have a contact angle relative to water in a range of about 40° to about 60°.

Hereinafter, each composition component is described in detail.

(A) Alkali Soluble Resin

The alkali soluble resin may be a polybenzoxazole precursor.

For example, the polybenzoxazole precursor may include a first polybenzoxazole precursor including a repeating unit represented by the following Chemical Formula 1, a repeating unit represented by the following Chemical Formula 2, or a combination thereof, and may include a thermally polymerizable functional group at least one terminal end of the first polybenzoxazole precursor; a second polybenzoxazole precursor a repeating unit represented by the following Chemical Formula 4, a repeating unit represented by the following Chemical Formula 5, or a combination thereof; or a combination thereof, but is not limited thereto.

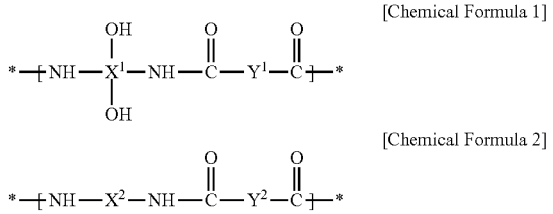

[Chemical Formula 1]

[Chemical Formula 2]

In Chemical Formulas 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 3, and $Y^1$ and $Y^2$ are the same or different in each repeating unit and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

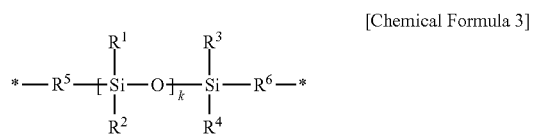

[Chemical Formula 3]

In Chemical Formula 3, $R^1$ to $R^4$ are the same or different and are each independently hydrogen, substituted or unsubstituted C1 to C30 alkyl, substituted or unsubstituted C6 to C30 aryl, substituted or unsubstituted C1 to C30 alkoxy, or hydroxy, $R^5$ and $R^6$ are the same or different and are each independently a single bond, substituted or unsubstituted C1 to C30 alkylene, or substituted or unsubstituted C6 to C30 arylene, and $k$ is an integer ranging from 1 to 50.

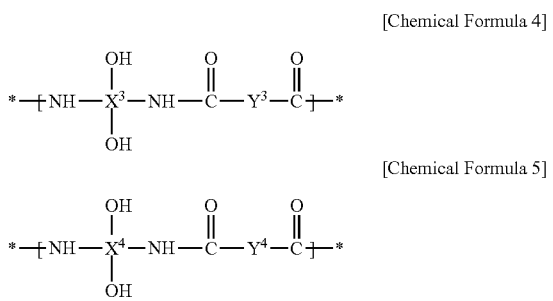

[Chemical Formula 4]

[Chemical Formula 5]

In Chemical Formulas 4 and 5, $X^3$ and $X^4$ are the same or different in each repeating unit and are each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and is a thermally polymerizable organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

Thermally polymerizable functional groups included in the polybenzoxazole precursor may be cross-linked during curing and may improve mechanical strength of a film formed of a positive photosensitive resin composition and residue removal properties of the positive photosensitive resin composition.

As a result, the positive photosensitive resin composition may have excellent sensitivity, resolution, film residue ratios, pattern formation properties and residue removal properties, and a photosensitive resin film formed of the positive photosensitive resin composition may have excellent mechanical properties.

In exemplary embodiments, $X^1$ may be a residual group derived from an aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

$X_1$ may include a functional group represented by the following Chemical Formulas 7 and 8, but is not limited thereto.

[Chemical Formula 7]

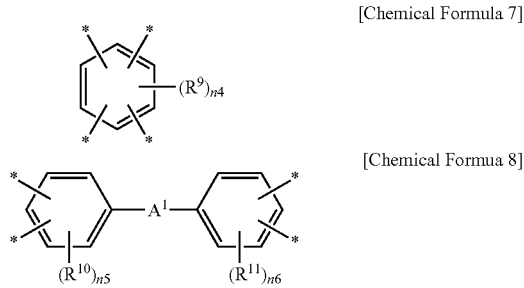

[Chemical Formula 8]

[Chemical Formula 9]

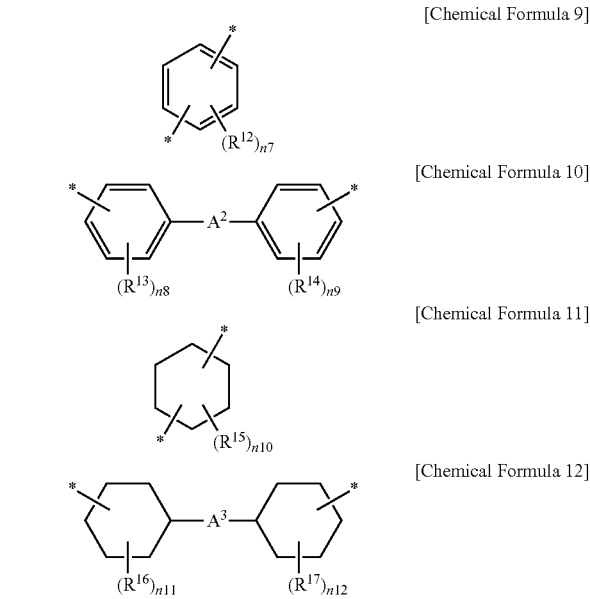

[Chemical Formula 10]

[Chemical Formula 11]

[Chemical Formula 12]

In Chemical Formulas 7 and 8, $A^1$ is —O—, —CO—, —$CR^{205}R^{206}$—, —$SO_2$—, —S—, or a single bond, wherein $R^{205}$ and $R^{206}$ are the same or different and are each independently hydrogen or substituted or unsubstituted alkyl, for example fluoroalkyl, $R^9$ to $R^{11}$ are the same or different and are each independently hydrogen, substituted or unsubstituted alkyl, substituted or unsubstituted carboxyl, hydroxy, or thiol, $n_4$ is an integer ranging from 1 or 2, and $n_5$ and $n_6$ are the same or different and are each independently integers ranging from 1 to 3.

In Chemical Formula 2, $X^2$ may be an aromatic organic group, a divalent to hexavalent aliphatic organic group, a divalent to hexavalent alicyclic organic group, or a functional group represented by the above Chemical Formula 3.

In exemplary embodiments, $X^2$ may be a residual group derived from aromatic diamine, alicyclic diamine, or silicon diamine.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, compounds having an alkyl group or a halogen substituted in an aromatic ring of the forgoing compounds, and the like, and combinations thereof.

Examples of the alicyclic diamine may include without limitation 1,4-diaminocyclohexane, 1,3-diaminocyclohexane, 1,2-diaminocyclohexane, 4,4'-methylenebiscyclohexylamine, 4,4'-methylenebis(2-methylcyclohexylamine), and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyptetramethyldisiloxane, 1,4-bis(γ-aminopropyldimethylsilyl)benzene, bis(4-aminobutyl) tetramethyldisiloxane, bis(γ-aminopropyl) tetraphenyldisiloxane, 1,3-bis(aminopropyl) tetramethyldisiloxane, and the like, and combinations thereof.

Examples of $X^2$ may include functional groups represented by the following Chemical Formulas 9 to 12, but are not limited thereto.

In Chemical Formulas 9 to 12, $A^2$ and $A^3$ are the same or different and are each independently —O—, —CO—, —$CR^{207}R^{208}$—, —$SO_2$—, —S—, or a single bond, wherein $R^{207}$ and $R^{208}$ are the same or different and are each independently hydrogen or substituted or unsubstituted alkyl, for example fluoroalkyl, $R^{12}$ to $R^{17}$ are the same or different and are each independently hydrogen, substituted or unsubstituted alkyl, substituted or unsubstituted carboxyl, hydroxy, or thiol, $n_7$ and $n_{10}$ are the same or different and are each independently an integer ranging from 1 to 4, and $n_8$, $n_9$, $n_{11}$ and $n_{12}$ are the same or different and are independently an integer ranging from 1 to 5.

In Chemical Formulas 1 and 2, $Y^1$ and $Y^2$ are the same or different and are independently an aromatic organic group, a divalent to hexavalent aliphatic organic group, or a divalent to hexavalent alicyclic organic group.

$Y^1$ and $Y^2$ may be a residual group derived from a dicarboxylic acid or a residual group derived from a dicarboxylic acid derivative.

Examples of dicarboxylic acids include without limitation $Y^1(COOH)_2$ or $Y^2(COOH)_2$ (wherein $Y^1$ and $Y^2$ are the same as $Y^1$ and $Y^2$ of the above Chemical Formulas 1 and 2).

Examples of dicarboxylic acid derivatives include without limitation carbonyl halide derivatives of $Y^1(COOH)_2$, carbonyl halide derivatives of $Y^2(COOH)_2$, active compounds of an active ester derivative obtained by reacting $Y^1(COOH)_2$ and 1-hydroxy-1,2,3-benzotriazole, active compounds of an active ester derivative obtained by reacting $Y^2(COOH)_2$ and 1-hydroxy-1,2,3-benzotriazole, and the like, and combinations thereof (wherein $Y^1$ and $Y^2$ are the same as $Y^1$ and $Y^2$ of the above Chemical Formulas 1 and 2).

Examples of dicarboxylic acid derivatives include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

Examples of $Y^1$ and $Y^2$ may independently include a functional group represented by the following Chemical Formulas 13 to 15, but are not limited thereto.

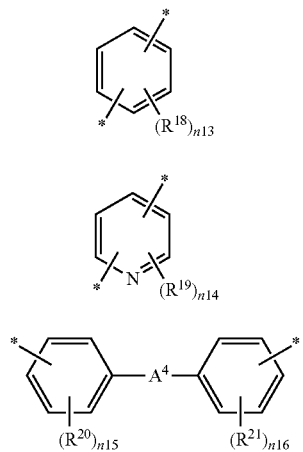

[Chemical Formula 13]

[Chemical Formula 14]

[Chemical Formula 15]

In Chemical Formulas 13 to 15, $R^{18}$ to $R^{21}$ are the same or different and are each independently hydrogen or substituted or unsubstituted alkyl, $n_{13}$ is an integer ranging from 1 to 4, $n_{14}$, $n_{15}$ and $n_{16}$ are the same or different and are each independently integers ranging from 1 to 3, and $A^4$ is —O—, —$CR^{209}R^{210}$—, —CO—, —CONH—, —S—, —$SO_2$—, or a single bond, wherein $R^{209}$ and $R^{210}$ are the same or different and are each independently hydrogen or substituted or unsubstituted alkyl, for example fluoroalkyl.

The first polybenzoxazole precursor may include a thermally polymerizable functional group at least one terminal end. The thermally polymerizable functional group can efficiently react with a thermally polymerizable organic group included in the second polybenzoxazole precursor and can increase the degree of cross-linking, which as a result can improve mechanical properties of a thermally cured film.

The thermally polymerizable functional group may be derived from an end-capping monomer. Examples of end-capping monomers include without limitation monoamines, monoanhydrides, monocarboxylic acid halides including a carbon-carbon multiple bond, and the like, and combinations thereof.

Examples of the monoamines include without limitation toluidine, dimethylaniline, ethylaniline, aminophenol, aminobenzylalcohol, aminoindan, aminoacetophenone, and the like, and combinations thereof.

Examples of the monoanhydrides include without limitation 5-norbornene-2,3-dicarboxylanhydride represented by the following Chemical Formula 16, 3,6-epoxy-1,2,3,6-tetra hydrophthalicanhydride represented by the following Chemical Formula 17, isobutenyl succinic anhydride represented by the following Chemical Formula 18, maleic anhydride, aconitic anhydride, 3,4,5,6-tetrahydrophthalic anhydride, cis-1,2,3,6,-tetrahydrophthalic anhydride, itaconic anhydride (IA), citraconic anhydride (CA), 2,3-dimethylmaleic anhydride (DMMA), and the like, and combinations thereof.

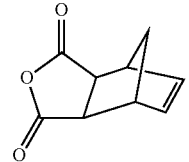

[Chemical Formula 16]

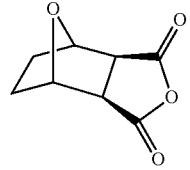

[Chemical Formula 17]

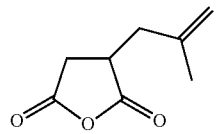

[Chemical Formula 18]

Examples of the thermally polymerizable functional group derived from a monoanhydride include a functional group represented by the following Chemical Formulas 19 to 23, but is not limited thereto. The thermally polymerizable functional group may be cross-linked during heating of the first polybenzoxazole precursor preparation process, and may be formed as a residual group at the terminal end of the first polybenzoxazole precursor.

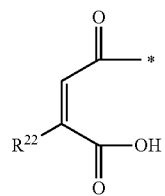

[Chemical Formula 19]

In Chemical Formula 19, $R^{22}$ is —H, —$CH_2COOH$, or —$CH_2CHCHCH_3$.

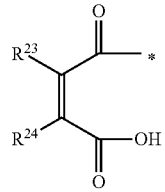

[Chemical Formula 20]

In Chemical Formula 20, $R^{23}$ and $R^{24}$ are the same or different and are each independently —H or —$CH_3$.

[Chemical Formula 21]

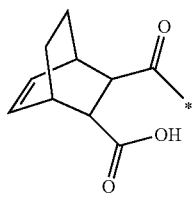

[Chemical Formula 22]

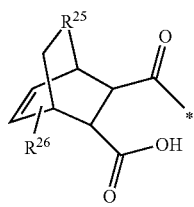

In Chemical Formula 22,
$R^{25}$ is —$CH_2$— or —O—, and $R^{26}$ is —H or —$CH_3$.

[Chemical Formula 23]

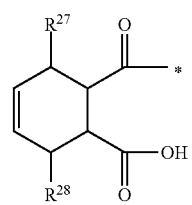

In Chemical Formula 23,
$R^{27}$ and $R^{28}$ are the same or different and are each independently —H, —$CH_3$, or —$OCOCH_3$.

The monocarboxylic acid halides including the carbon-carbon multiple bonds may be represented by the following Chemical Formula 24.

[Chemical Formula 24]

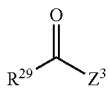

In Chemical Formula 24,
$R^{29}$ is a substituted or unsubstituted alicyclic organic group or a substituted or unsubstituted aromatic organic group. The substituted alicyclic organic group or substituted aromatic organic group is substituted with a substituent including a substituted or unsubstituted amidino group, a substituted or unsubstituted alicyclic organic group, or a fused ring of a substituted or unsubstituted alicyclic organic group and an aryl group. The alicyclic organic group as a substituent may be a maleimide group.

$Z^3$ is —F, —Cl, —Br, or —I.

Examples of the monocarboxylic acid halides including a carbon-carbon multiple bond include without limitation 5-norbornene-2-carboxylic acid halide represented by the following Chemical Formula 25, 4-nadimido benzoylhalide represented by the following Chemical Formula 26, 4-(4-phenylethynylphthimido)benzoylhalide represented by the following Chemical Formula 27, 4-(2-phenylmaleicimido)benzoylhalide represented by the following Chemical Formula 28, benzoylhalide represented by the following Chemical Formula 29, cyclobenzoylhalide represented by the following Chemical Formula 30, 4-(3-phenylethynylphthimido)benzoylhalide, 4-maleimido benzoylhalide, and the like, and combinations thereof.

[Chemical Formula 25]

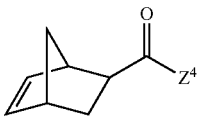

[Chemical Formula 26]

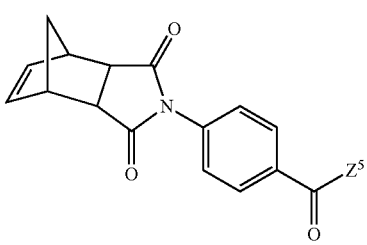

[Chemical Formula 27]

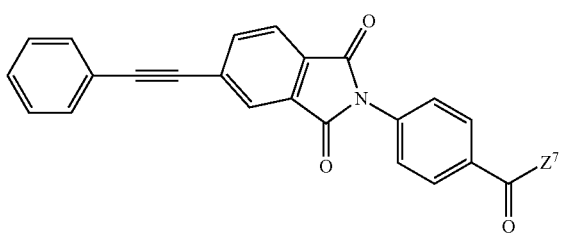

[Chemical Formula 28]

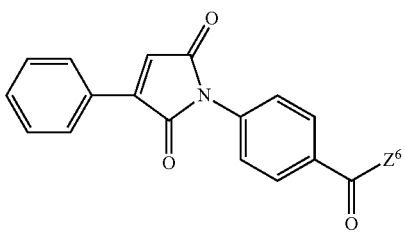

[Chemical Formula 29]

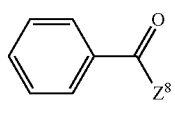

[Chemical Formula 30]

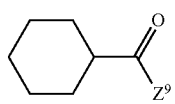

In Chemical Formulas 25 to 30,
$Z^4$ to $Z^9$ are the same or different and are each independently —F, —Cl, —Br, or —I.

In Chemical Formulas 4 and 5, $X^3$ and $X^4$ may be an aromatic organic group, an aliphatic organic group, or an alicyclic organic group.

In exemplary embodiments, each $X^3$ and $X^4$ is a residual group derived from aromatic diamine.

Examples of the aromatic diamine and examples of $X^3$ and $X^4$ are the same as examples of the aromatic diamine from which $X^1$ is derived and examples of $X^1$ described above.

In Chemical Formula 4, $Y^3$ is a thermally polymerizable organic group, and a residual group of a dicarboxylic acid derivative.

Examples of the dicarboxylic acid derivative may include without limitation carbonyl halide derivatives of $Y^3(COOH)_2$, active compounds of an active ester derivative obtained by reacting Y³(COOH)₂ and 1-hydroxy-1,2,3-benzotriazole, and the like, and combinations thereof, and may include a carbon-carbon double bond being capable of performing a thermal polymerization in its structure.

Also, a derivative of tetracarboxylic acid diester dicarboxylic acid obtained from an alcohol-addition decomposition reaction of tetracarboxylic acid dianhydride may be used. That is to say, tetracarboxylic acid diester dicarboxylic acid obtained from an alcohol-addition decomposition reaction of tetracarboxylic acid dianhydride using an alcohol compound having a thermally polymerizable functional group may be used.

In exemplary embodiments, $Y^3$ may be a functional group represented by the following Chemical Formulas 31 to 33, but is not limited thereto.

[Chemical Formula 31]

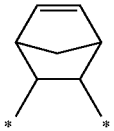

[Chemical Formula 32]

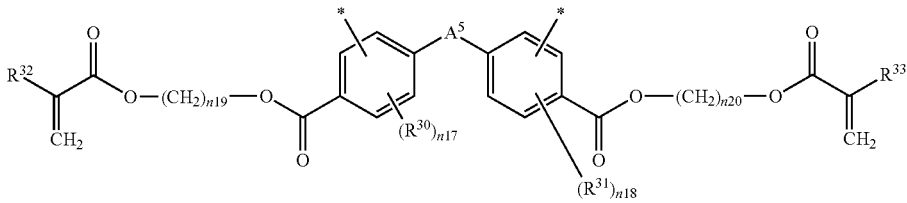

[Chemical Formula 33]

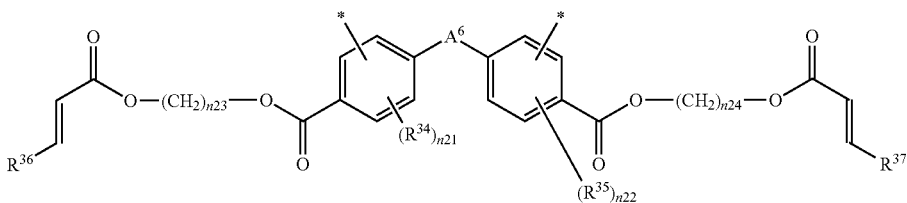

In Chemical Formulas 31 and 33, $R^{30}$ to $R^{37}$ are the same or different and are each independently hydrogen, substituted or unsubstituted C1 to C30 alkyl, or substituted or unsubstituted C6 to C30 aryl, $n_{17}$, $n_{18}$, $n_{21}$ and $n_{22}$ are the same or different and are each independently integers ranging from 1 to 4, $n_{19}$, $n_{20}$, $n_{23}$ and $n_{24}$ are the same or different and are each independently integers ranging from 2 to 20, and $A^5$ and $A^6$ are the same or different, and are each independently —O—, —CO— or —SO₂—.

In exemplary embodiments, $Y^3$ may include functional groups represented by the following Chemical Formulas 34 to 39, but is not limited thereto.

[Chemical Formula 34]

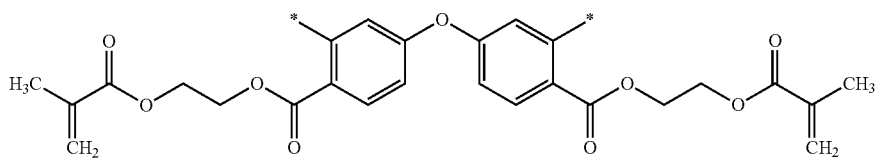

[Chemical Formula 35]

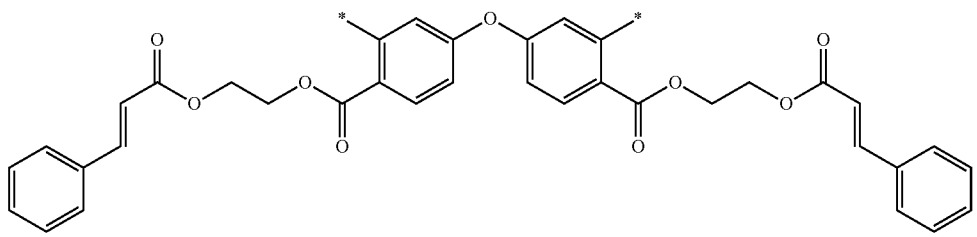

-continued

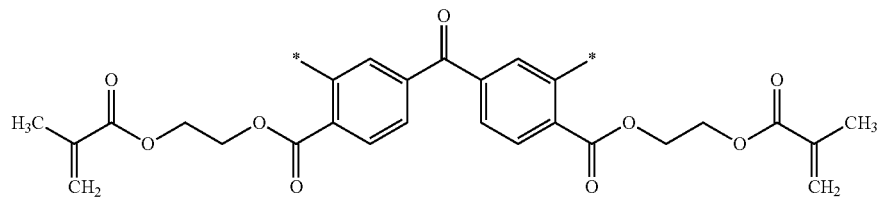

[Chemical Formula 36]

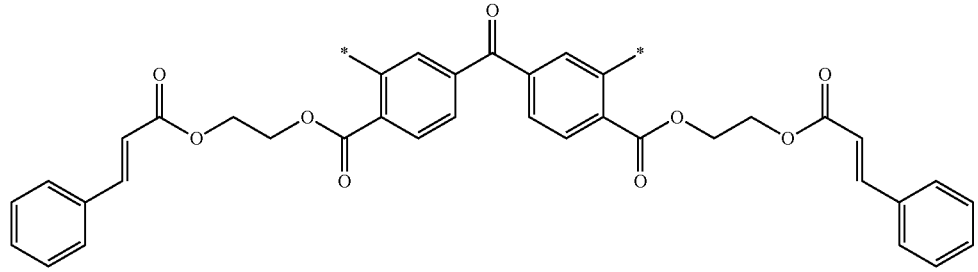

[Chemical Formula 37]

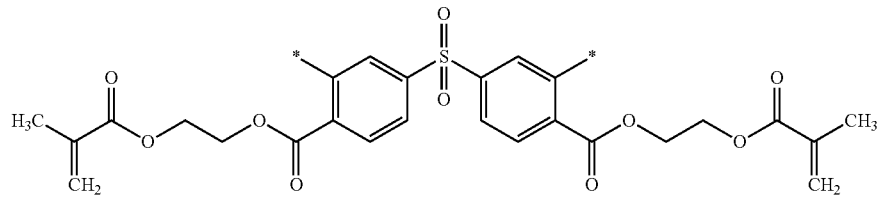

[Chemical Formula 38]

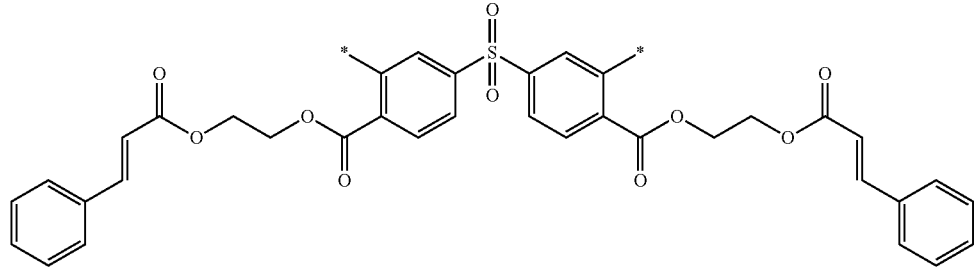

[Chemical Formula 39]

In Chemical Formula 5, $Y^4$ may be the same or different and each is independently an aromatic organic group, a divalent to hexavalent aliphatic organic group, or a divalent to hexavalent alicyclic organic group.

$Y^4$ may be a residual group derived from a dicarboxylic acid or a residual group derived from a dicarboxylic acid derivative.

The dicarboxylic acid may be $Y^4(COOH)_2$ (wherein $Y^4$ is the same as $Y^4$ of the above Chemical Formula 5).

Examples of the dicarboxylic acid derivative may include without limitation carbonyl halide derivatives of $Y^4(COOH)_2$, active compounds of an active ester derivative obtained by reacting $Y^4(COOH)_2$ (wherein $Y^4$ is the same as $Y^4$ of the above Chemical Formula 5) and 1-hydroxy-1,2,3-benzotriazole, and the like, and combinations thereof.

Examples of the dicarboxylic acid derivative and examples of $Y^4$ are the same as examples of dicarboxylic acid derivative from which $Y^1$ and $Y^2$ are derived and examples of $Y^1$ and $Y^2$ described above.

When the alkali soluble resin includes the first polybenzoxazole precursor and the second polybenzoxazole precursor, the second polybenzoxazole precursor may be included in an amount of about 1 parts by weight to about 30 parts by weight, for example about 5 parts by weight to about 20 parts by weight, based on about 100 parts by weight of the first polybenzoxazole precursor.

In some embodiments, the alkali soluble resin may include the second polybenzoxazole precursor in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the second polybenzoxazole precursor can be in a range from about any of the foregoing amounts to about any other of the foregoing amounts.

When the alkali soluble resin includes the second polybenzoxazole precursor in an amount within the above range, dissolution deterioration may be adjusted within an appropriate range and the film residue ratio of an unexposed part may not decrease, and thus resolution can be improved and also, cross-linking effects can be promoted, which can provide excellent mechanical properties of a cured film. In addition, including the second polybenzoxazole precursor in an amount within the above range may adjust the degree of cross-linking of a film after the curing within an appropriate range and thus can provide a cured film with excellent mechanical properties.

The alkali soluble resin may have a weight average molecular weight (Mw) of about 3,000 g/mol to about 50,000 g/mol. When the alkali soluble resin has a weight average molecular weight within the above range, sufficient properties and simultaneously, sufficient dissolution property in an organic solvent may be secured, loss of film thickness of the unexposed part during development may be reduced, sufficient cross-linking can be provided, and thus mechanical properties of a film can be improved, and a residue after the development may not remain.

(B) Dissolution Controlling Agent

The dissolution controlling agent may include the compound represented by the above Chemical Formula 6.

In exemplary embodiments, the compound represented by the above Chemical Formula 6 may include the compounds represented by the following Chemical Formulas 6a to 6f, or a combination thereof, but is not limited thereto.

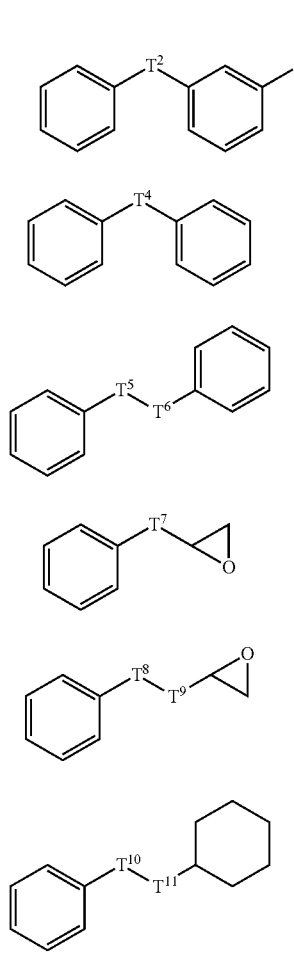

[Chemical Formula 6a]

[Chemical Formula 6b]

[Chemical Formula 6c]

[Chemical Formula 6d]

[Chemical Formula 6e]

[Chemical Formula 6f]

In Chemical Formulas 6a to 6f, $T^2$ to $T^{11}$ are the same or different and are each independently a single bond, —O—, —CO—, —CONH—, —S—, —SO$_2$—, substituted or unsubstituted C1 to C10 alkyleneoxy (—OR$^{400}$—, wherein R$^{400}$ is substituted or unsubstituted alkylene), or substituted or unsubstituted C6 to C15 aryleneoxy (—OR$^{401}$—, wherein R$^{401}$ is substituted or unsubstituted arylene).

In exemplary embodiments, the compound represented by the above Chemical Formula 6 may be a compound represented by the following Chemical Formulas 40 to 45, or a combination thereof, but is not limited thereto.

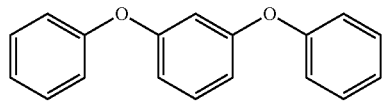

[Chemical Formula 40]

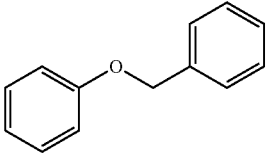

[Chemical Formula 41]

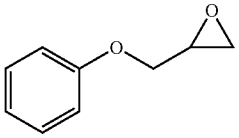

[Chemical Formula 42]

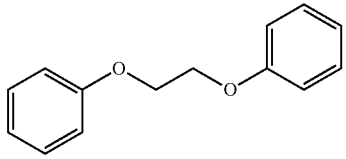

[Chemical Formula 43]

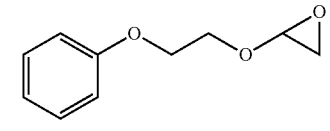

[Chemical Formula 44]

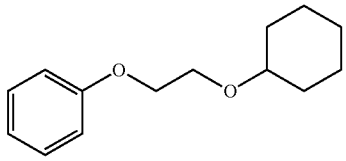

[Chemical Formula 45]

The compound represented by the above Chemical Formula 6 may have a molecular weight of about 1,000 or less. When the compound represented by the above Chemical Formula 6 used to adjust dissolution has a molecular weight within the above range, it may more have excellent dissolution-adjusting capability, specifically capability of suppressing dissolution in an unexposed part without having an influence on sensitivity and also, easily remove a scum after the development.

The compound represented by the above Chemical Formula 6 includes atoms with polarity such as oxygen (O), sulfur (S), and the like in a part of the molecules and atoms with non-polarity such as carbon (C), hydrogen (H), and the like in other parts of the molecules.

The atoms with polarity such as oxygen (O), sulfur (S), and the like in the compound represented by the above Chemical Formula 6 can form a hydrogen bond with a polybenzoxazole precursor and a photosensitive diazoquinone compound and may not be not exposed on the surface of the unexposed part of a film. In contrast, the atoms with non-polarity in the molecules of the compound represented by the above Chemical Formula 6 do not participate in a hydrogen bond and may be exposed on the surface of the unexposed part of a film. Accordingly, the unexposed part may exhibit minimal or no dissolution in an alkali developing solution.

On the other hand, the compound represented by the above Chemical Formula 6 reacts with acid generated by a photosensitive diazoquinone compound as a photoacid generator and changes into a material well-dissolved in an alkali development solution with high polarity in an exposed part. Accordingly, the exposed part can be well dissolved in an alkali development solution. However, the terminal end of the compound represented by the above Chemical Formula 6 is not dissociated by the aforementioned acid.

The dissolution controlling agent including the compound represented by the above Chemical Formula 6 can control an unexposed part to have non-polarity and an exposed part to have polarity and thus, increase a dissolution rate difference between the unexposed part and the exposed part. Accordingly, the dissolution controlling agent may improve a film residue ratio, pattern formation properties, sensitivity, and resolution.

In addition, the dissolution controlling agent may increase wettability of a photoacid generator and a polybenzoxazole precursor remaining in an exposed part relative to a development solution and effectively remove a scum (a development scum) and thus improve residue removal properties.

The dissolution controlling agent may be used alone but is not limited thereto and can optionally be used together with a resorcinol-based phenol compound. When the dissolution controlling agent is used with a resorcinol-based phenol compound, the excessive amount of the resorcinol-based phenol compound can play a role of a plasticizer and can deteriorate a pattern after curing. However, the dissolution controlling agent does not play a role of a plasticizer and effectively maintains a pattern after curing. Accordingly, the dissolution controlling agent may maintain excellent reliability of the positive photosensitive resin composition.

The positive photosensitive resin composition may include the dissolution controlling agent in an amount of about 0.1 parts by weight to about 30 parts by weight, for example about 1 part by weight to about 10 parts by weight, based on about 100 parts by weight of the alkali soluble resin. In some embodiments, the positive photosensitive resin composition may include the dissolution controlling agent in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the dissolution controlling agent can be in a range from about any of the foregoing amounts to about any other of the foregoing amounts.

When the dissolution controlling agent is included in an amount within the above range, it may suppress dissolution in an unexposed part and maintain excellent sensitivity and thus, easily remove a scum.

(C) Photosensitive Diazoquinone Compound

The photosensitive diazoquinone compound may be a compound including a 1,2-benzoquinone diazide or 1,2-naphthoquinone diazide structure.

The photosensitive diazoquinone compound may include the compounds represented by the following Chemical Formulas 46, and 48 to 50, or a combination thereof, but is not limited thereto.

[Chemical Formula 46]

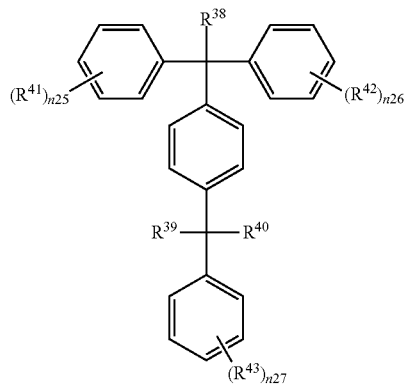

In Chemical Formula 46, $R^{38}$ to $R^{40}$ are the same or different and are each independently hydrogen or substituted or unsubstituted C1 to C30 alkyl, for example —CH$_3$, $R^{41}$ to $R^{43}$ are the same or different and are each independently —OQ, wherein Q is hydrogen, a functional group represented by the following Chemical Formula 47a, or a functional group represented by the following Chemical Formula 47b, provided that all Qs are not simultaneously hydrogen, and $n_{25}$ to $n_{27}$ are the same or different and are independently integers ranging from 1 to 3.

[Chemical Formula 47a]

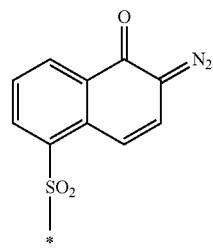

[Chemical Formula 47b]

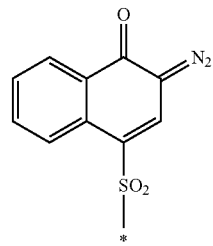

[Chemical Formula 48]

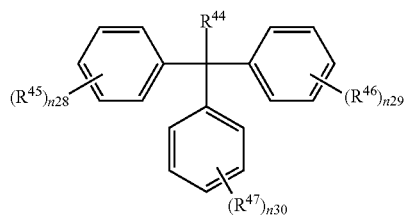

In Chemical Formula 48, $R^{44}$ is hydrogen or substituted or unsubstituted C1 to C30 alkyl, $R^{45}$ to $R^{47}$ are the same or different and are each independently —OQ, wherein Q is the same as defined in the above Chemical Formula 46, and $n_{28}$ to $n_{30}$ are the same or different and are each independently integers ranging from 1 to 3.

[Chemical Formula 49]

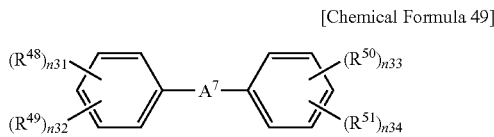

In Chemical Formula 49, $A^7$ is —CO— or —$CR^{211}R^{212}$—, wherein $R^{211}$ and $R^{212}$ are the same or different and are each independently substituted or unsubstituted C1 to C30 alkyl, $R^{48}$ to $R^{51}$ are the same or different and are each independently hydrogen, substituted or unsubstituted C1 to C30 alkyl, —OQ, or —NHQ, wherein Q is the same as defined in Chemical Formula 46, $n_{31}$ to $n_{34}$ are the same or different and are each independently integers ranging from 1 to 4, $n_{31}+n_{32}$ and $n_{33}+n_{34}$ are the same or different and are each independently integers of 5 or less, provided that at least one of $R^{48}$ and $R^{49}$ is —OQ, and one aromatic ring includes one to three —OQs and the other aromatic ring includes one to four —OQs.

[Chemical Formula 50]

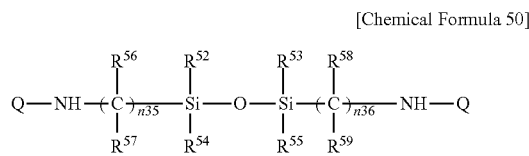

In Chemical Formula 50, $R^{52}$ to $R^{59}$ are the same or different and are each independently hydrogen or substituted or unsubstituted C1 to C30 alkyl, $n_{35}$ and $n_{36}$ are the same or different and are each independently integers ranging from 1 to 5, and Q is the same as defined in Chemical Formula 46.

The positive photosensitive resin composition may include the photosensitive diazoquinone compound in an amount of about 5 parts by weight to about 100 parts by weight, based on about 100 parts by weight of the alkali soluble resin. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the positive photosensitive resin composition includes the photosensitive diazoquinone compound in an amount within the above range, the pattern can be well-formed without a residue from exposure, and loss of film thickness during development can be prevented to thereby provide a good pattern.

(D) Silane Compound

The silane compound improves adherence between the photosensitive resin composition and a substrate.

Examples of the silane compound may include without limitation compounds represented by the following Chemical Formulas 51 to 53; vinyltrimethoxysilane, vinyltriethoxysilane, vinyltrichlorosilane, vinyltris(β-methoxyethoxy)silane, 2-(3,4-epoxycyclohexyl)ethyltrimethoxysilane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane, trimethoxy[3-(phenylamino)propyl]silane, and the like, and combinations thereof.

[Chemical Formula 51]

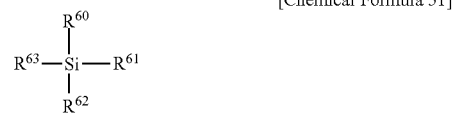

In Chemical Formula 51, $R^{60}$ is a vinyl group, substituted or unsubstituted alkyl, or substituted or unsubstituted aryl, for example 3-(meth)acryloxypropyl, p-styryl, 2-(3,4-epoxycyclohexyl)ethyl, or 3-(phenylamino)propyl, $R^{61}$ to $R^{63}$ are the same or different and are each independently substituted or unsubstituted alkoxy, substituted or unsubstituted alkyl, or halogen, wherein at least one of $R^{61}$ to $R^{63}$ is alkoxy or halogen, for example the alkoxy may be C1 to C8 alkoxy and the alkyl may be C1 to C20 alkyl.

[Chemical Formula 52]

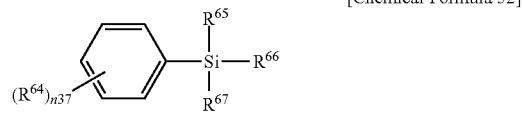

In Chemical Formula 52, $R^{64}$ is —$NH_2$ or —$NHCOCH_3$, $R^{65}$ to $R^{67}$ are the same or different and are each independently substituted or unsubstituted alkoxy, for example the alkoxy may be —$OCH_3$ or —$OCH_2CH_3$, and $n_{37}$ is an integer ranging from 1 to 5.

[Chemical Formula 53]

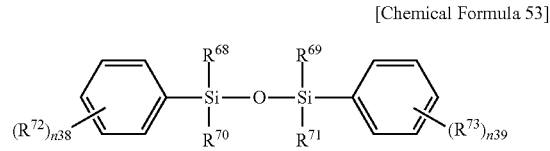

In Chemical Formula 53, $R^{68}$ to $R^{71}$ are the same or different and are each independently substituted or unsubstituted alkyl or substituted or unsubstituted alkoxy, and for example —$CH_3$ or —$OCH_3$, $R^{72}$ and $R^{73}$ are the same or different and are each independently substituted or unsubstituted amino, for example —$NH_2$ or —$NHCOCH_3$, and $n_{38}$ and $n_{39}$ are the same or different and are each independently an integer ranging from 1 to 5.

The positive photosensitive resin composition may include the silane compound in an amount of about 0.1 parts by weight to about 30 parts by weight based on about 100 parts by weight of the alkali soluble resin. In some embodiments, the positive photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the positive photosensitive resin composition includes the silane compound in an amount within the above range, adherence between lower and upper layers can be sufficiently improved, residual film may not remain after development, and optical properties (transmittance) and mechanical properties such as tensile strength, elongation, and the like may be improved.

(E) Solvent

The solvent may be an organic solvent. Examples of the organic solvent may include without limitation N-methyl-2-pyrrolidone, gamma-butyrolactone, N,N-dimethylacetamide, dimethylsulfoxide, diethyleneglycoldimethylether, diethyleneglycoldiethylether, diethyleneglycoldibutylether, propyleneglycolmonomethylether, dipropyleneglycolmonomethylether, propyleneglycolmonomethylether acetate, methyllactate, ethyllactate, butyllactate, methyl-1,3-butyleneglycolacetate, 1,3-butyleneglycol-3-monomethylether, methyl pyruvate, ethylpyruvate, methyl-3-methoxy propionate, and the like, and combinations thereof.

The positive photosensitive resin composition may include the solvent in an amount of about 50 parts by weight to about 900 parts by weight, based on about 100 parts by weight of the alkali soluble resin. When the solvent is used in an amount within the above range, a sufficiently thick film can be obtained, and good solubility and coating can be provided.

(F) Other Additive(s)

The positive photosensitive resin composition according to one embodiment can optionally further include one or more (F) other additives.

A non-limiting example of an additive includes a latent thermal acid generator. Examples of the latent thermal acid generator include without limitation arylsulfonic acids such as p-toluenesulfonic acid, benzenesulfonic acid, and the like; perfluoroalkylsulfonic acids such as trifluoromethanesulfonic acid, trifluorobutanesulfonic acid, and the like; alkylsulfonic acids such as methanesulfonic acid, ethanesulfonic acid, butanesulfonic acid, and the like; and the like, and combinations thereof.

The latent thermal acid generator is a catalyst for a dehydration reaction and a cyclization reaction of phenolic hydroxy group-contained polyamide of the polybenzoxazole precursor, and thus a cyclization reaction may be performed smoothly even if a curing temperature is decreased.

In addition, the positive photosensitive resin composition may further include an additive such as a suitable surfactant or leveling agent to prevent a stain of the film or to improve the development.

An exemplary process for forming a pattern using a positive photosensitive resin composition includes: coating a positive photosensitive resin composition on a supporting substrate; drying the coated positive photosensitive resin composition to provide a positive photosensitive resin composition layer; exposing the positive photosensitive resin composition layer; developing the positive photosensitive resin composition layer using an alkali aqueous solution to provide a photosensitive resin film; and heating the photosensitive resin film. The conditions of processes to provide a pattern are widely known in this art, so detailed descriptions thereof will be omitted in this specification.

According to another embodiment, a photosensitive resin film fabricated using the positive photosensitive resin composition is provided. The photosensitive resin film may be an insulation layer or a protective layer.

According to yet another embodiment, a semiconductor device including the photosensitive resin film is provided.

The positive photosensitive resin composition may be applicable for forming an insulation layer, a passivation layer, or a buffer coating layer of a semiconductor device. That is to say, the positive photosensitive resin composition may be applicable for forming a surface protective layer and an interlayer insulating layer of a semiconductor device.

EXAMPLES

The following examples illustrate the present invention in more detail. However, it is understood that the present invention is not limited by these examples.

Synthesis Example 1

Synthesis of Polybenzoxazole Precursor (PBO-1)

17.4 g of 2,2-bis(3-amino-4-hydroxyphenyl)-1,1,1,3,3,3-hexafluoropropane and 0.86 g of 1,3-bis(aminopropyl)tetramethyldisiloxane are put in a four-necked flask mounted with an agitator, a temperature controlling device, a nitrogen gas injector, and a Condenser while nitrogen is passed therethrough, and 280 g of N-methyl-2-pyrrolidone (NMP) is dissolved therein. The solution has a solid content of 9 wt %.

When the solid is completely dissolved, 9.9 g of pyridine is added thereto. The mixture is maintained at a temperature raging from 0° C. to 5° C., and a solution prepared by dissolving 13.3 g of 4,4'-oxydibenzoylchloride in 142 g of N-methyl-2-pyrrolidone (NMP) is slowly added thereto in a dropwise fashion for 30 minutes. The resulting mixture is reacted for one 1 hour at a temperature ranging from 0° C. to 5° C. and then heated up to room temperature of 25° C. and reacted for 1 hour.

Then, 1.6 g of 5-norbornene-2,3-dicarboxylanhydride is added to the resulting reactant. The mixture is reacted and agitated at 70° C. for 24 hours. The reactant is added to a solution prepared by mixing water/methanol in a volume ratio of 10/1 to produce a precipitate. The precipitate is filtered, sufficiently cleansed with water, vacuum-dried at 80° C. for 24 hours or more, preparing a polybenzoxazole precursor (PBO-1).

Synthesis Example 2

Synthesis of Polybenzoxazole Precursor (PBO-2)

A polybenzoxazole precursor (PBO-2) is prepared according to the same method as Synthesis Example 1 except for using maleic anhydride instead of 5-norbornene-2,3-dicarboxylanhydride.

Example 1

Preparation of Positive Photosensitive Resin Composition 15 g of the polybenzoxazole precursor (PBO-1) according to Synthesis Example 1 is dissolved in 35.0 g of gamma-butyrolactone (GBL), and 0.3 g of 1,3-diphenoxybenzene represented by the following Chemical Formula 40, 2.25 g of a photosensitive diazoquinone compound represented by the following Chemical Formula 54, and 0.75 g of 2-(3,4-epoxy-cyclohexyl)ethyltrimethoxysilane represented by the following Chemical Formula 55 are added thereto and dissolved therein. The mixture is filtered with a 0.45 μm fluororesin filter, preparing a positive photosensitive resin composition.

[Chemical Formula 40]

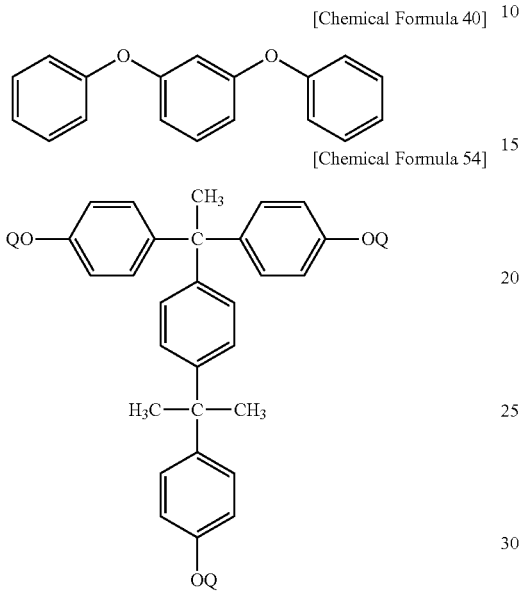

[Chemical Formula 54]

In Chemical Formula 54,

Q is the same as defined in the above Chemical Formula 46, about 67% (⅔) of the Q is the group represented by the following Chemical Formula 47b.

[Chemical Formula 47b]

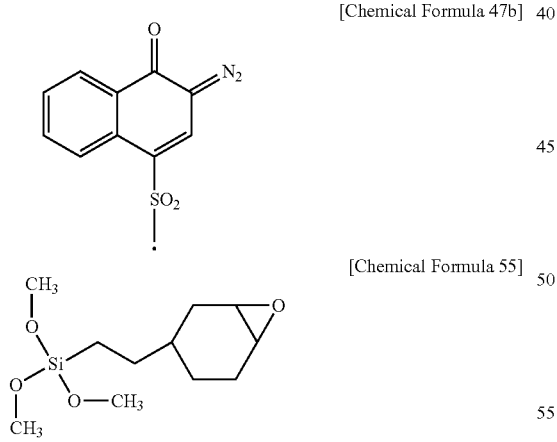

[Chemical Formula 55]

Example 2

Preparation of Positive Photosensitive Resin Composition

A positive photosensitive resin composition is prepared according to the same method as Example 1 except for using 1.5 g of 1,3-diphenoxybenzene represented by the above Chemical Formula 40 instead of 0.3 g thereof.

Example 3

Preparation of Positive Photosensitive Resin Composition

A positive photosensitive resin composition is prepared according to the same method as Example 1 except for using 0.3 g of benzylphenylether represented by the following Chemical Formula 41 instead of 0.3 g of 1,3-diphenoxybenzene represented by the above Chemical Formula 40.

[Chemical Formula 41]

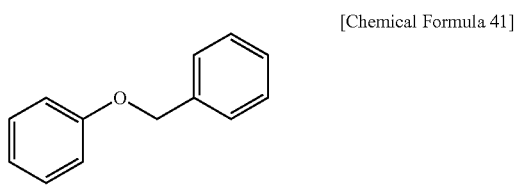 [SMILES: c1ccc(COc2ccccc2)cc1]

Example 4

Preparation of Positive Photosensitive Resin Composition

A positive photosensitive resin composition is prepared according to the same method as Example 3 except for using 1.5 g of benzylphenylether represented by the above Chemical Formula 41 instead of 0.3 g thereof.

Example 5

Preparation of Positive Photosensitive Resin Composition

A positive photosensitive resin composition is prepared according to the same method as Example 1 except for using 0.3 g of phenylglycidylether represented by the following Chemical Formula 42 instead of 0.3 g of 1,3-diphenoxybenzene represented by the above Chemical Formula 40.

[Chemical Formula 42]

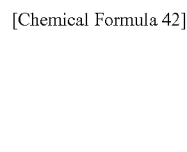

Example 6

Preparation of Positive Photosensitive Resin Composition

A positive photosensitive resin composition is prepared according to the same method as Example 5 except for using 1.5 g of phenylglycidylether represented by the above Chemical Formula 42 instead of 0.3 g thereof.

Example 7

Preparation of Positive Photosensitive Resin Composition

A positive photosensitive resin composition is prepared according to the same method as Example 1 except for using 0.3 g of 1,2-diphenoxyethane represented by the following Chemical Formula 43 instead of 0.3 g of 1,3-diphenoxybenzene represented by the above Chemical Formula 40.

[Chemical Formula 43]

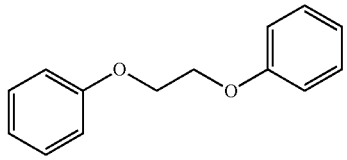

Example 8

Preparation of Positive Photosensitive Resin Composition

A positive photosensitive resin composition is prepared according to the same method as Example 7 except for using 1.5 g of 1,2-diphenoxyethane represented by the above Chemical Formula 43 instead of 0.3 g thereof.

Example 9

Preparation of Positive Photosensitive Resin Composition

A positive photosensitive resin composition is prepared according to the same method Example 1 except for using 0.3 g of a compound represented by the following Chemical Formula 44 instead of 0.3 g of 1,3-diphenoxybenzene represented by the above Chemical Formula 40.

[Chemical Formula 44]

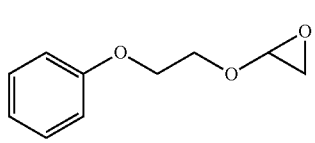

Example 10

Preparation of Positive Photosensitive Resin Composition

A positive photosensitive resin composition is prepared according to the same method as Example 9 except for using 1.5 g of a compound represented by the above Chemical Formula 44 instead of 0.3 g thereof.

Example 11

Preparation of Positive Photosensitive Resin Composition

A positive photosensitive resin composition is prepared according to the same method as Example 1 except for using 0.3 g of a compound represented by the following Chemical Formula 45 instead of 0.3 g of a compound represented by the above Chemical Formula 40.

[Chemical Formula 45]

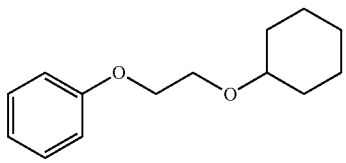

Example 12

Preparation of Positive Photosensitive Resin Composition

A photosensitive resin composition is prepared according to the same method as Example 11 except for using 1.5 g of a compound represented by the above Chemical Formula 45 instead of 0.3 g thereof.

Examples 13 to 24

Preparation of Positive Photosensitive Resin Composition

A positive photosensitive resin composition is prepared according to the same method as each Example 1 to 12 except for using 15 g of the polybenzoxazole precursor (PBO-2) according to Synthesis Example 2 instead of 15 g of the polybenzoxazole precursor (PBO-1) according to Synthesis Example 1.

Comparative Example 1

Preparation of Positive Photosensitive Resin Composition

A positive photosensitive resin composition is prepared by adding 15 g of the polybenzoxazole precursor (PBO-1) according to Synthesis Example 1 to 35.0 g of gamma-butyrolactone (GBL) and dissolving therein, adding 3.0 g of a photosensitive diazoquinone compound represented by the above Chemical Formula 54 and 0.75 g of 2-(3,4-epoxycyclohexyl)ethyltrimethoxysilane represented by the above Chemical Formula 55 and dissolving therein, and filtrating the mixture with a 0.45 μm fluororesin filter.

Comparative Example 2

Preparation of Positive Photosensitive Resin Composition

A positive photosensitive resin composition is prepared by dissolving 15 g of the polybenzoxazole precursor (PBO-1) according to Synthesis Example 1 in 35.0 g of gamma-butyrolactone (GBL), adding 0.3 g of diphenyliodonium nitrate represented by the following Chemical Formula 56, 2.25 g of a photosensitive diazoquinone compound represented by the above Chemical Formula 54, and 0.75 g of 2-(3,4-epoxycyclohexyl)ethyltrimethoxysilane represented by the above Chemical Formula 55 and dissolving therein, and filtrating the mixture with a 0.45 μm fluororesin filter.

[Chemical Formula 56]

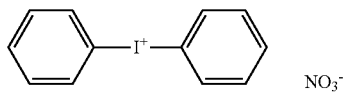

Comparative Example 3

Preparation of Positive Photosensitive Resin Composition

A positive photosensitive resin composition is prepared according to the same method as Comparative Example 2 except for using 1.5 g of diphenyliodonium nitrate represented by the above Chemical Formula 56 instead of 0.3 g thereof.

Comparative Example 4

Preparation of Positive Photosensitive Resin Composition

A positive photosensitive resin composition is prepared according to the same method as Comparative Example 2 except for using 0.3 g of a compound represented by the following Chemical Formula 57 instead of 0.3 g of diphenyliodonium nitrate represented by the above Chemical Formula 56.

[Chemical Formula 57]

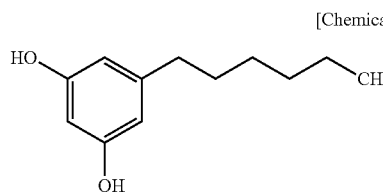

Comparative Example 5

Preparation of Positive Photosensitive Resin Composition

A positive photosensitive resin composition is prepared according to the same method as Comparative Example 4 except for using 1.5 g of a compound represented by the above Chemical Formula 57 instead of 0.3 g thereof.

Comparative Example 6

Preparation of Positive Photosensitive Resin Composition

A positive photosensitive resin composition is prepared according to the same method as Comparative Example 2 except for using 0.3 g of 3-methoxybenzoic acid represented by the following Chemical Formula 58 instead of 0.3 g of diphenyliodonium nitrate represented by the above Chemical Formula 56.

[Chemical Formula 58]

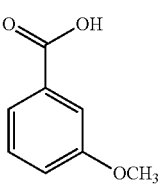

Comparative Example 7

Preparation of Positive Photosensitive Resin Composition

A positive photosensitive resin composition is prepared according to the same method as Comparative Example 6 except for using 1.5 g of 3-methoxybenzoic acid represented by the above Chemical Formula 58 instead of 0.3 g thereof.

Comparative Example 8

Preparation of Positive Photosensitive Resin Composition

A positive photosensitive resin composition is prepared according to the same method as Comparative Example 2 except for using 0.3 g of a compound represented by the following Chemical Formula 59 instead of 0.3 g of diphenyliodonium nitrate represented by the above Chemical Formula 56.

[Chemical Formula 59]

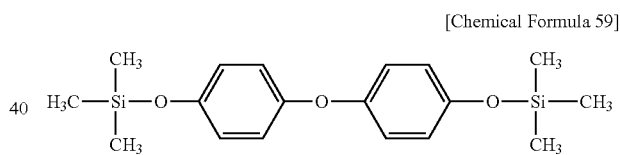

Comparative Example 9

Preparation of Positive Photosensitive Resin Composition

A positive photosensitive resin composition is prepared according to the same method as Comparative Example 8 except for using 1.5 g of a compound represented by the above Chemical Formula 59 instead of 0.3 g thereof.

Comparative Examples 10 to 18

Preparation of Positive Photosensitive Resin Composition

A positive photosensitive resin composition is prepared according to the same method as each Comparative Example 1 to 9 except for using 15 g of the polybenzoxazole precursor (PBO-2) according to Synthesis Example 2 instead of 15 g of the polybenzoxazole precursor (PBO-1) according to Synthesis Example 1.

Experimental Example 1

Sensitivity and Film Residue Ratio

The positive photosensitive resin compositions according to Examples 1 to 24 and Comparative Examples 1 to 18 is coated on a 8 inch wafer by using a K-SPIN8 track equipment made by KDNS Inc. and then, heated on a hot plate at 120° C. for 4 minutes, forming a polybenzoxazole precursor film.

The polybenzoxazole precursor films are exposed to a light at 250 ms with a I-line stepper (NSR i10C) made by Nikon Co. by using a mask having variously-sized patterns. The exposed part is dissolved and removed for 40 seconds (2 puddles) in a 2.38 wt % tetramethylammonium hydroxide (TMAH) aqueous solution at a room temperature and then, washed with pure water for 30 seconds. Then, the obtained pattern is cured under an oxygen concentration of 1,000 ppm or below at 150° C. for 30 minutes and additionally at 320° C. for 30 minutes by using an electric furnace, fabricating a film with a pattern.

The sensitivity of the film is measured by measuring the time required for a 10 μm L/S pattern to form a 1:1 line width as an optimal exposure time after the exposure and development. The result is provided in the following Table 1.

In general, a film should have small thickness decrease during the development, since a film thickness decrease rate during the development has an influence on developability and a final thickness. Accordingly, the thickness changes of the film are measured by dipping a prebaked film in a 2.38 wt % tetramethylammoniumhydroxide (TMAH) aqueous solution every measurement time and developing it in a water-cleaning method. Then, their film residual rates (thickness after the development/thickness before the development, unit %) are calculated, and the results are provided in the following Table 1. Film thickness change after prebaking, development, and curing is measured by using equipment made by KMAC Inc. (ST4000-DLX).

Experimental Example 2

Contact Angle Measurement

The positive photosensitive resin compositions according to Examples 1 to 24 and Comparative Examples 1 to 18 are coated on an 8-inch wafer by using a K-SPIN8 track equipment made by KDNS Inc. and heated at 120° C. for 4 minutes, forming a polybenzoxazole precursor film.

The polybenzoxazole precursor films are exposed to a light at 250 ms with an I-line stepper (NSR i10C) made by Nikon Co. by using a mask with variously-sized patterns. The exposed part is dissolved and removed in a 2.38 wt % tetramethylammonium hydroxide (TMAH) aqueous solution through two puddles at a room temperature for 40 seconds and cleaned with pure water for 30 seconds.

The films are measured regarding contact angle by using DAS-100 contact angle analyzer made by KRÜSS GmbH in a Target method 1. First of all, the silicon wafer is baked on a 100° C. hot plate for 10 minutes to remove moisture on the surface and cooled down to a room temperature for 2 minutes. Then, the silicon wafer is put on the stage of a contact angle analyzer, 3 μl of a water drop is dropped thereon, and the contact angle of the water drop is measured for 10 seconds after 3 seconds. The surface shape change of the liquid is tracked depending on time and 50 times measured for 10 seconds at 17 points thereof in total, and the average of the measurements are calculated, which is called to be a 'dynamic' method.

The results are provided in the following Table 1.

TABLE 1

| | Polybenzoxazole precursor (g) | Dissolution controlling agent (g) | Sensitivity (mJ/cm$^2$) | Film residue ratio (%) | Contact angle of Unexposed part (degree) | Contact angle of exposed part (degree) |
|---|---|---|---|---|---|---|
| Example 1 | PBO-1 15 g | Chemical Formula 40 (0.3 g) | 380 | 92 | 71 | 48 |
| Example 2 | | Chemical Formula 40 (1.5 g) | 420 | 94 | 73 | 48 |
| Example 3 | | Chemical Formula 41 (0.3 g) | 410 | 91 | 70 | 47 |
| Example 4 | | Chemical Formula 41 (1.5 g) | 460 | 93 | 72 | 48 |
| Example 5 | | Chemical Formula 42 (0.3 g) | 400 | 90 | 72 | 51 |
| Example 6 | | Chemical Formula 42 (1.5 g) | 470 | 94 | 76 | 52 |
| Example 7 | | Chemical Formula 43 (0.3 g) | 370 | 90 | 69 | 45 |
| Example 8 | | Chemical Formula 43 (1.5 g) | 430 | 91 | 71 | 47 |
| Example 9 | | Chemical Formula 44 (0.3 g) | 400 | 92 | 73 | 51 |
| Example 10 | | Chemical Formula 44 (1.5 g) | 470 | 95 | 75 | 52 |

TABLE 1-continued

|  | Polybenzoxazole precursor (g) | Dissolution controlling agent (g) | Sensitivity (mJ/cm$^2$) | Film residue ratio (%) | Contact angle of Unexposed part (degree) | Contact angle of exposed part (degree) |
|---|---|---|---|---|---|---|
| Example 11 |  | Chemical Formula 45 (0.3 g) | 350 | 91 | 70 | 42 |
| Example 12 |  | Chemical Formula 45 (1.5 g) | 390 | 93 | 72 | 44 |
| Comparative Example 1 |  | — | 660 | 92 | 56 | 50 |
| Comparative Example 2 |  | Chemical Formula 56 (0.3 g) | 710 | 91 | 71 | 69 |
| Comparative Example 3 |  | Chemical Formula 56 (1.5 g) | 1200 | 98 | 82 | 82 |
| Comparative Example 4 |  | Chemical Formula 57 (0.3 g) | 600 | 86 | 56 | 55 |
| Comparative Example 5 |  | Chemical Formula 57 (1.5 g) | 400 | 71 | 50 | 40 |
| Comparative Example 6 |  | Chemical Formula 58 (0.3 g) | 630 | 82 | 51 | 50 |
| Comparative Example 7 |  | Chemical Formula 58 (1.5 g) | 350 | 68 | 49 | 40 |
| Comparative Example 8 |  | Chemical Formula 59 (0.3g) | 750 | 92 | 66 | 64 |
| Comparative Example 9 |  | Chemical Formula 59 (1.5 g) | 1050 | 96 | 71 | 70 |
| Example 13 | PBO-2 15 g | Chemical Formula 40 (0.3 g) | 360 | 90 | 69 | 46 |
| Example 14 |  | Chemical Formula 40 (1.5 g) | 400 | 92 | 71 | 46 |
| Example 15 |  | Chemical Formula 41 (0.3 g) | 390 | 89 | 68 | 45 |
| Example 16 |  | Chemical Formula 41 (1.5 g) | 440 | 91 | 70 | 46 |
| Example 17 |  | Chemical Formula 42 (0.3 g) | 380 | 88 | 70 | 49 |
| Example 18 |  | Chemical Formula 42 (1.5 g) | 450 | 92 | 74 | 50 |
| Example 19 |  | Chemical Formula 43 (0.3 g) | 350 | 88 | 67 | 43 |
| Example 20 |  | Chemical Formula 43 (1.5 g) | 410 | 89 | 69 | 45 |
| Example 21 |  | Chemical Formula 44 (0.3 g) | 380 | 90 | 71 | 49 |
| Example 22 |  | Chemical Formula 44 (1.5 g) | 450 | 93 | 73 | 50 |
| Example 23 |  | Chemical Formula 45 (0.3 g) | 330 | 89 | 68 | 40 |
| Example 24 |  | Chemical Formula 45 (1.5 g) | 370 | 91 | 70 | 42 |
| Comparative Example 10 |  | — | 630 | 90 | 55 | 49 |
| Comparative Example 11 |  | Chemical Formula 56 (0.3 g) | 680 | 89 | 70 | 68 |

TABLE 1-continued

| | Polybenzoxazole precursor (g) | Dissolution controlling agent (g) | Sensitivity (mJ/cm$^2$) | Film residue ratio (%) | Contact angle of Unexposed part (degree) | Contact angle of exposed part (degree) |
|---|---|---|---|---|---|---|
| Comparative Example 12 | | Chemical Formula 56 (1.5 g) | 1140 | 96 | 80 | 80 |
| Comparative Example 13 | | Chemical Formula 57 (0.3 g) | 570 | 84 | 55 | 54 |
| Comparative Example 14 | | Chemical Formula 57 (1.5 g) | 380 | 70 | 49 | 39 |
| Comparative Example 15 | | Chemical Formula 58 (0.3 g) | 600 | 80 | 50 | 49 |
| Comparative Example 16 | | Chemical Formula 58 (1.5 g) | 330 | 67 | 48 | 39 |
| Comparative Example 17 | | Chemical Formula 59 (0.3 g) | 710 | 90 | 65 | 63 |
| Comparative Example 18 | | Chemical Formula 59 (1.5 g) | 1000 | 94 | 70 | 69 |

As shown in Table 1, the films formed by using the positive photosensitive resin compositions according to Examples 1 to 24 have excellent sensitivity and film residue ratio characteristics. The larger the difference between contact angle of an unexposed part and contact angle of an exposed part the films have, the better sensitivity the films have.

On the other hand, the films formed of the positive photosensitive resin compositions according to Comparative Examples 1 to 4, Comparative Example 6, Comparative Examples 8 to 13, Comparative Example 15, and Comparative Examples 17 and 18 have a film residue ratio characteristic corresponding to the film residue ratio of the positive photosensitive resin composition according to Examples 1 to 24 but very poor sensitivity characteristic. In addition, the films formed of the positive photosensitive resin compositions according to Comparative Example 5, 7, 14, and 16 have sensitivity characteristic corresponding to the films formed of positive photosensitive resin compositions according to Examples 1 to 24 but very poor film residue ratio characteristic.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:
1. A positive photosensitive resin composition, comprising:
(A) an alkali soluble resin;
(B) a dissolution controlling agent including the compound represented by the following Chemical Formula 6;
(C) a photosensitive diazoquinone compound;
(D) a silane compound; and
(E) a solvent:

[Chemical Formula 6]

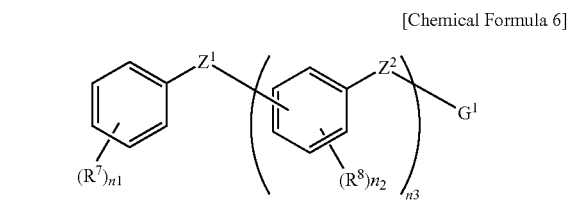

wherein, in Chemical Formula 6,
$Z^1$ is a single bond, —O—, —CO—, —CONH—, —S—, —SO$_2$—, substituted or unsubstituted C1 to C10 alkyleneoxy (—OR$^{203}$—, wherein R$^{203}$ is substituted or unsubstituted alkylene), or substituted or unsubstituted C6 to C15 aryleneoxy (—OR$^{204}$—, wherein R$^{204}$ is substituted or unsubstituted arylene),
$Z^2$ is a single bond, —O—, —CO—, —CONH—, —S—, —SO$_2$—, —OR$^{203}$—, wherein R$^{203}$ is substituted or unsubstituted alkylene or —OR$^{204}$—, wherein R$^{204}$ is substituted or unsubstituted arylene, with the proviso that when $Z^2$ is a single bond, then $Z^1$ is —OR$^{203}$—, wherein R$^{203}$ is substituted or unsubstituted alkylene or —OR$^{204}$—, wherein R$^{204}$ is substituted or unsubstituted arylene,
$G^1$ is hydrogen, a substituted or unsubstituted C1 to C30 aliphatic organic group, a substituted or unsubstituted C3 to C30 alicyclic organic group, a substituted or unsubstituted C6 to C30 aromatic organic group, a substituted or unsubstituted C2 to C30 heterocyclic group, or -T$^1$-R$^{300}$, wherein T$^1$ is a single bond, —O—, —CO—, —CONH—, —S—, —SO$_2$—, substituted or unsubstituted C1 to C10 alkyleneoxy (—OR$^{301}$—, wherein R$^{301}$ is substituted or unsubstituted alkylene), or substituted or unsubstituted C6 to C15 aryleneoxy (—OR$^{302}$—, wherein R$^{302}$ is a substituted or unsubstituted arylene), and R$^{300}$ is a substituted or unsubstituted C1 to C30 aliphatic organic group, a substituted or unsubstituted C3 to C30 alicyclic organic group, a substituted or unsubstituted C6 to C30 aromatic organic group, or a substituted or unsubstituted C2 to C30 heterocyclic group, R[7] and R[8] are the same or different and are each independently hydrogen or a substituted or unsubstituted C1 to C30 aliphatic organic group, n1 is an integer ranging from 0 to 5, n2 is an integer ranging from 0 to 4, and n3 is an integer ranging from 0 to 10.

2. The positive photosensitive resin composition of claim 1, wherein the compound represented by Chemical Formula 6 comprises a compound represented by one of the following Chemical Formulas 6a to 6f, or a combination thereof:

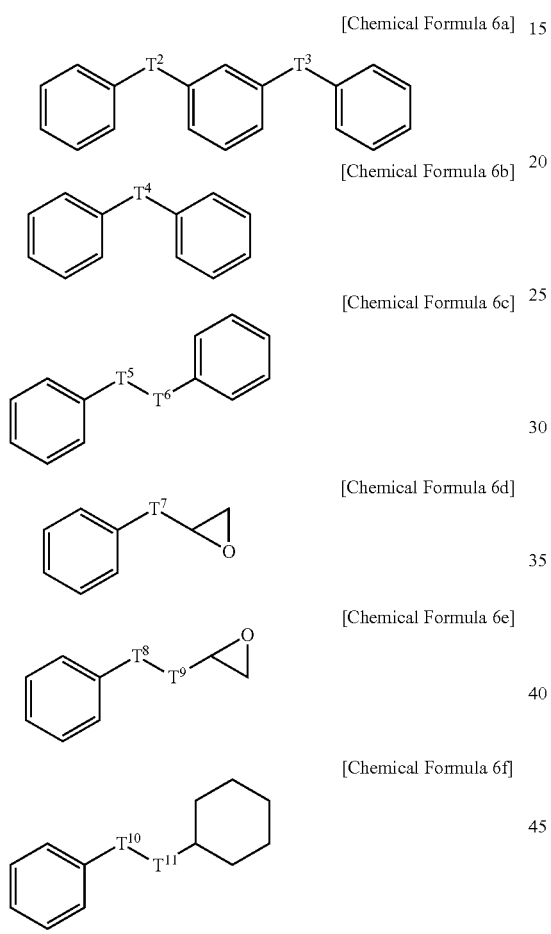

[Chemical Formula 6a]

[Chemical Formula 6b]

[Chemical Formula 6c]

[Chemical Formula 6d]

[Chemical Formula 6e]

[Chemical Formula 6f]

wherein, in Chemical Formulas 6a to 6f,

T[2] to T[3] and T[6] to T[11] are the same or different and are each independently a single bond, —O—, —CO—, —CONH—, —S—, —SO$_2$—, —OR$^{400}$—, wherein R$^{400}$ is substituted or unsubstituted alkylene, or (—OR$^{401}$—, wherein R$^{401}$ is substituted or unsubstituted arylene); and T[4] and T[5] are the same or different and are each independently —OR$^{400}$—, wherein R$^{400}$ is substituted or unsubstituted alkylene or —OR$^{401}$—, wherein R$^{401}$ is substituted or unsubstituted arylene.

3. The positive photosensitive resin composition of claim 1, wherein the compound represented by Chemical Formula 6 comprises a compound represented by one of the following Chemical Formulas 40 to 45, or a combination thereof:

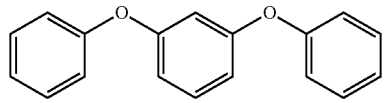

[Chemical Formula 40]

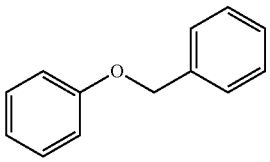

[Chemical Formula 41]

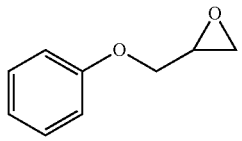

[Chemical Formula 42]

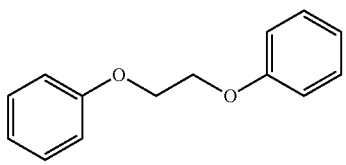

[Chemical Formula 43]

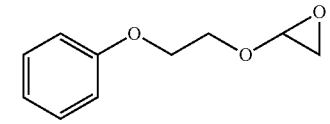

[Chemical Formula 44]

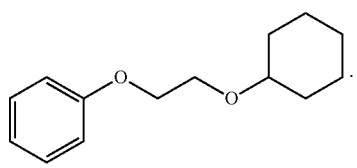

[Chemical Formula 45]

4. The positive photosensitive resin composition of claim 1, wherein the alkali soluble resin is a polybenzoxazole precursor.

5. The positive photosensitive resin composition of claim 4, wherein the polybenzoxazole precursor (A) is a first polybenzoxazole precursor including a repeating unit represented by the following Chemical Formula 1, a repeating unit represented by the following Chemical Formula 2, or a combination thereof, and including a thermally polymerizable functional group at at least one terminal end of the first polybenzoxazole precursor; a second polybenzoxazole precursor a repeating unit represented by the following Chemical Formula 4, a repeating unit represented by the following Chemical Formula 5, or a combination thereof; or a combination thereof:

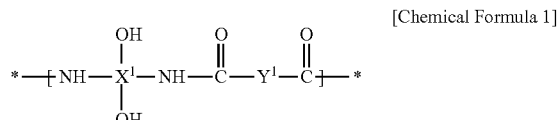

[Chemical Formula 1]

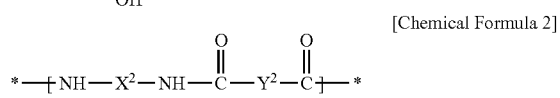

[Chemical Formula 2]

wherein, in Chemical Formulas 1 and 2, $X^1$ is the same or different in each repeating unit and is each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $X^2$ is the same or different in each repeating unit and is each independently a substituted or unsubstituted C6 to C30 aromatic organic group, a substituted or unsubstituted divalent to hexavalent C1 to C30 aliphatic organic group, a substituted or unsubstituted divalent to hexavalent C3 to C30 alicyclic organic group, or a functional group represented by the following Chemical Formula 3, and $Y^1$ and $Y^2$ are the same or different and are each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group,

[Chemical Formula 3]

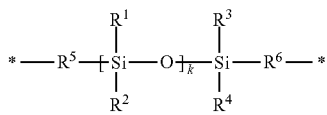

wherein, in Chemical Formula 3, $R^1$ to $R^4$ are the same or different and are each independently hydrogen, substituted or unsubstituted C1 to C30 alkyl, substituted or unsubstituted C6 to C30 aryl, substituted or unsubstituted C1 to C30 alkoxy, or hydroxy, $R^5$ and $R^6$ are the same or different and are each independently a single bond, substituted or unsubstituted C1 to C30 alkylene, or substituted or unsubstituted C6 to C30 arylene, and k is an integer ranging from 1 to 50,

[Chemical Formula 4]

*―(NH―$X^3$―NH―C(=O)―$Y^3$―C(=O))―*
              |
              OH
              |
              OH

[Chemical Formula 5]

*―(NH―$X^4$―NH―C(=O)―$Y^4$―C(=O))―*
              |
              OH
              |
              OH wherein, in Chemical Formulas 4 and 5, $X^3$ and $X^4$ are the same or different and are each independently a substituted or unsubstituted C6 to C30 aromatic organic group, a substituted or unsubstituted tetravalent to hexavalent C1 to C30 aliphatic organic group, or a substituted or unsubstituted tetravalent to hexavalent C3 to C30 alicyclic organic group, $Y^3$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and is a thermally polymerizable organic group, and $Y^4$ is the same or different in each repeating unit and is each independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

6. The positive photosensitive resin composition of claim 1, wherein the alkali soluble resin has a weight average molecular weight (Mw) of about 3,000 g/mol to about 50,000 g/mol.

7. The positive photosensitive resin composition of claim 1, wherein the positive photosensitive resin composition comprises
about 0.1 parts by weight to about 30 parts by weight of the dissolution controlling agent (B);
about 5 parts by weight to about 100 parts by weight of the photosensitive diazoquinone compound (C);
about 0.1 parts by weight to about 30 parts by weight of the silane compound (D); and
about 50 parts by weight to about 900 parts by weight of the solvent (E)
based on about 100 parts by weight of the alkali soluble resin (A).

8. A photosensitive resin film fabricated the positive photosensitive resin composition according to claim 1.

9. A semiconductor device comprising the photosensitive resin film according to claim 8.

10. A positive photosensitive resin composition, comprising:
(A) an alkali soluble resin;
(B) a dissolution controlling agent including a compound represented by one of the following Chemical Formulas 40 to 45, or a combination thereof;
(C) a photosensitive diazoquinone compound;
(D) a silane compound; and
(E) a solvent,

[Chemical Formula 40]

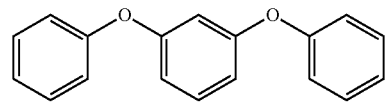

[Chemical Formula 41]

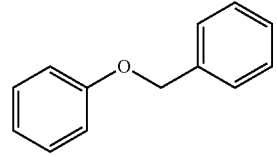

[Chemical Formula 42]

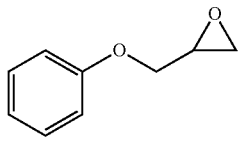

[Chemical Formula 43]

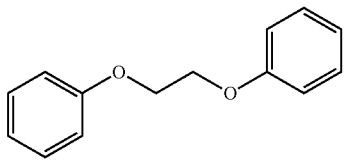

[Chemical Formula 44]
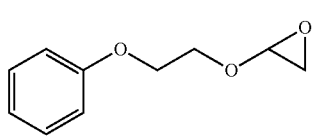
[Chemical Formula 45]
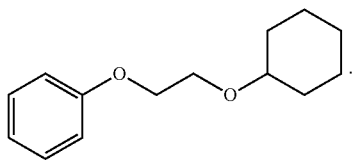
* * * * *